US011150198B2

(12) United States Patent
Cho et al.

(10) Patent No.: US 11,150,198 B2
(45) Date of Patent: Oct. 19, 2021

(54) METHOD FOR INSPECTING BALL GRID ARRAY-TYPE SEMICONDUCTOR CHIP PACKAGE

(71) Applicant: Korea Advanced Institute of Science and Technology, Daejeon (KR)

(72) Inventors: Seungryong Cho, Daejeon (KR); Miran Park, Daejeon (KR); Hoyeon Lee, Gyeonggi-do (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 319 days.

(21) Appl. No.: 16/326,340

(22) PCT Filed: Oct. 18, 2017

(86) PCT No.: PCT/IB2017/056460
§ 371 (c)(1),
(2) Date: Feb. 18, 2019

(87) PCT Pub. No.: WO2018/033898
PCT Pub. Date: Feb. 22, 2018

(65) Prior Publication Data
US 2019/0227001 A1 Jul. 25, 2019

(30) Foreign Application Priority Data
Aug. 18, 2016 (KR) .......................... 10-2016-0104830

(51) Int. Cl.
*G06T 7/00* (2017.01)
*G01N 21/95* (2006.01)
(Continued)

(52) U.S. Cl.
CPC ....... *G01N 21/9501* (2013.01); *G01N 21/951* (2013.01); *G01N 21/95684* (2013.01);
(Continued)

(58) Field of Classification Search
CPC ... G06F 30/392; H01L 23/573; H01L 23/585; G06T 7/001; G01N 21/9501; G01N 21/951; H04N 13/20
See application file for complete search history.

(56) References Cited

U.S. PATENT DOCUMENTS

2016/0358746 A1* 12/2016 Hirai ...................... G06T 7/001

FOREIGN PATENT DOCUMENTS

JP 2015194500 A 11/2015
KR 20060127537 A 12/2006
(Continued)

OTHER PUBLICATIONS

International Search Report issued in International Application No. PCT/IB2017/056460 dated Jan. 15, 2018 (5 pages).
(Continued)

*Primary Examiner* — Phuoc H Doan
(74) *Attorney, Agent, or Firm* — Osha Bergman Watanabe & Burton LLP

(57) ABSTRACT

Disclosed are a method, an apparatus, and a system for inspecting a ball grid array-type semiconductor chip package. A first embodiment of the present invention provides an apparatus for inspecting a semiconductor chip package, the apparatus comprising: a first image acquisition unit for acquiring a reference image using a three-dimensional image of a semiconductor chip serving as a reference, the reference image being obtained by removing a region of interest from the three-dimensional image; a second image acquisition unit for acquiring a two-dimensional image of a semiconductor chip to be inspected; and an image processing unit for deriving an image of a region of interest of the semiconductor chip to be inspected, from the difference between the reference image and the two-dimensional image.

12 Claims, 9 Drawing Sheets

(51) Int. Cl.
   *G01N 21/956* (2006.01)
   *G01N 23/18* (2018.01)
   *G01R 31/311* (2006.01)
   *H04N 13/20* (2018.01)

(52) U.S. Cl.
   CPC ........... *G01N 23/18* (2013.01); *G01R 31/311* (2013.01); *G06T 7/00* (2013.01); *G06T 7/001* (2013.01); *H04N 13/20* (2018.05); *G01N 2021/95646* (2013.01); *G06T 2207/20104* (2013.01); *G06T 2207/30148* (2013.01)

(56) References Cited

FOREIGN PATENT DOCUMENTS

| | | |
|---|---|---|
| KR | 20080002044 A | 1/2008 |
| KR | 101094412 B1 | 12/2011 |
| KR | 101293532 B1 | 8/2013 |

OTHER PUBLICATIONS

Written Opinion issued in International Application No. PCT/IB2017/056460 dated Jan. 15, 2018 (5 pages).
Bae, Ki-Tae et al., "A Visual Inspection System for Defects of BGA Using PC-based Image Processing Board" Korean Institute of Information Scientists and Engineers, 1998, pp. 535-537 (6 pages).

\* cited by examiner

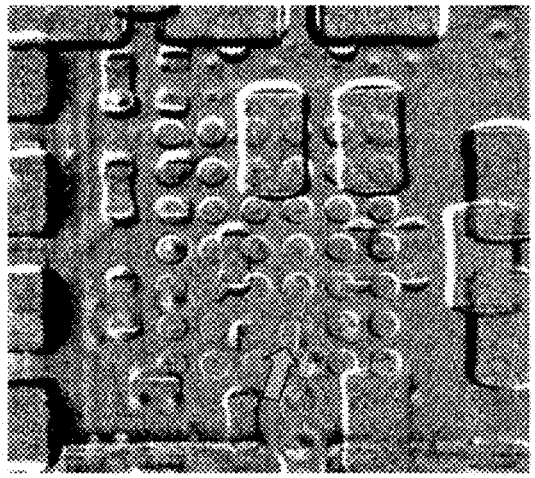
[Fig. 1A]
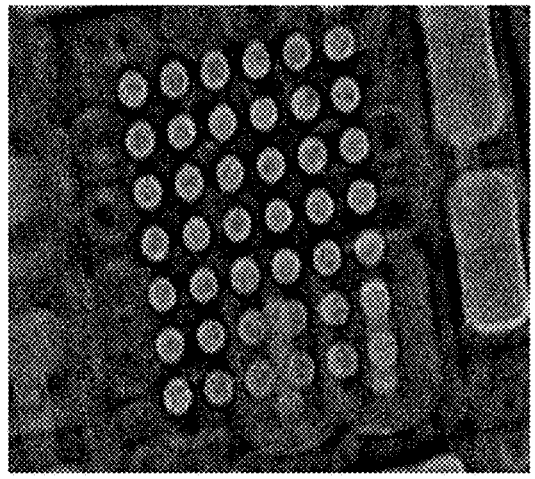
[Fig. 1B]
[Fig. 2]
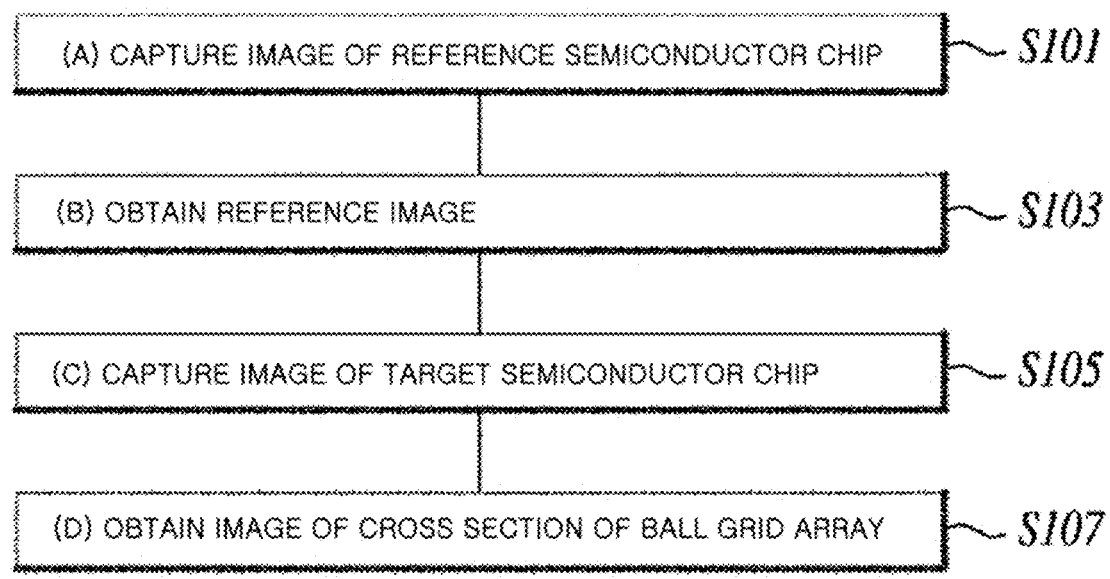

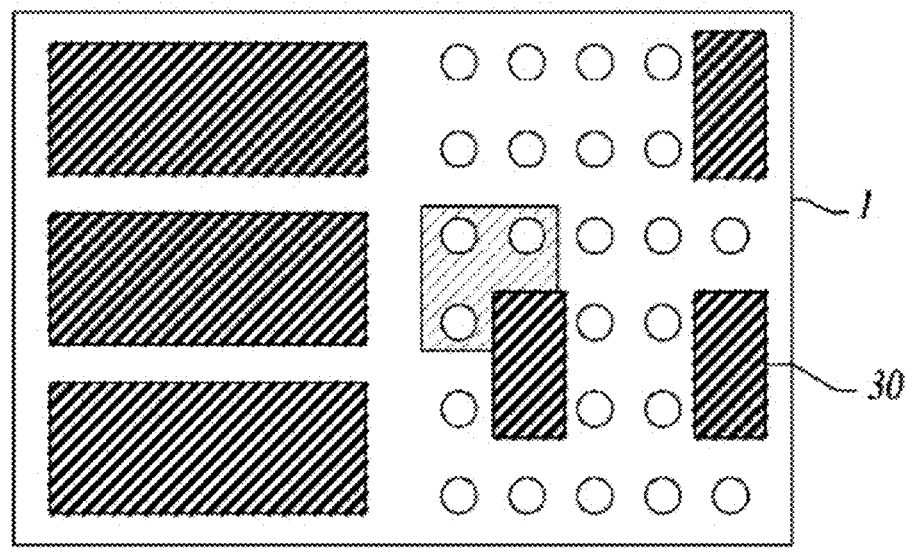
[Fig. 3A]
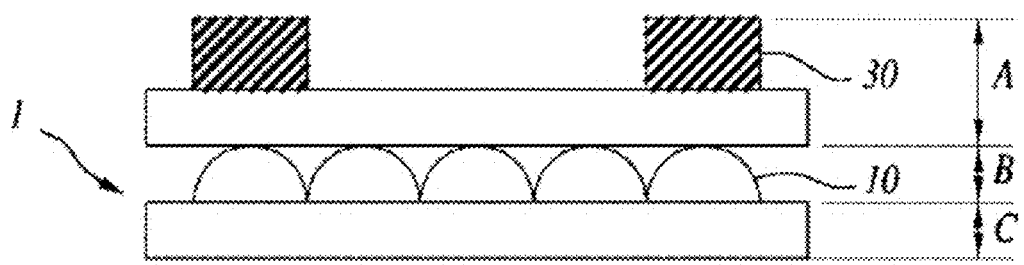
[Fig. 3B]

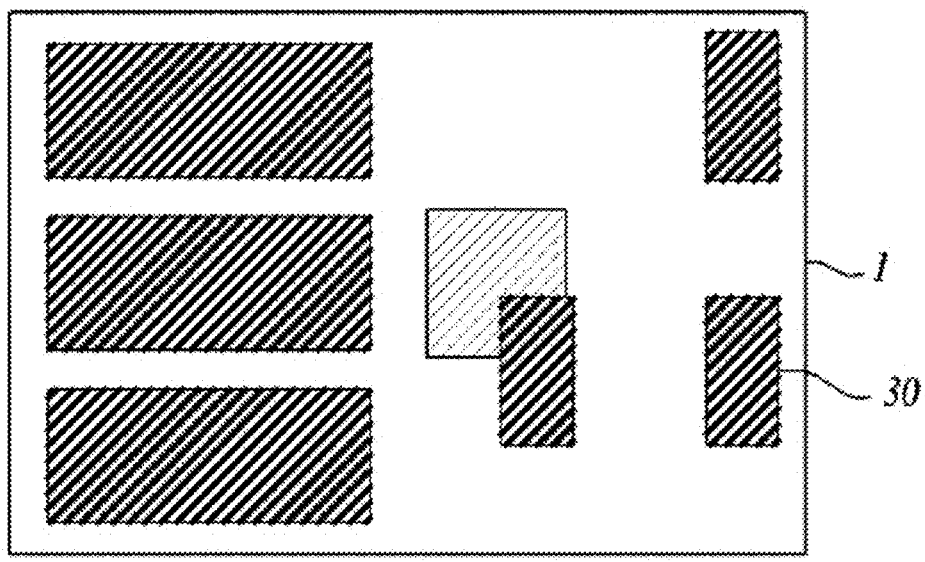
[Fig. 4A]
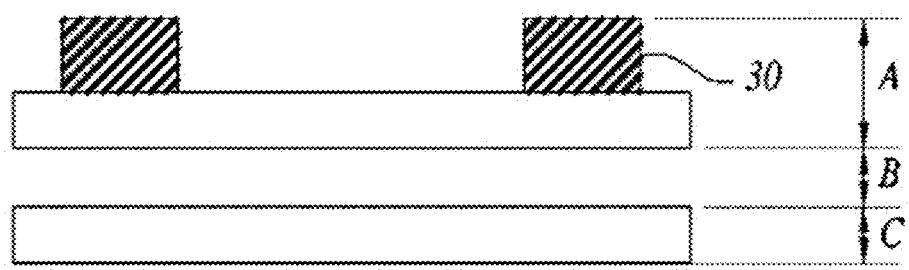
[Fig. 4B]

[FIG. 5]
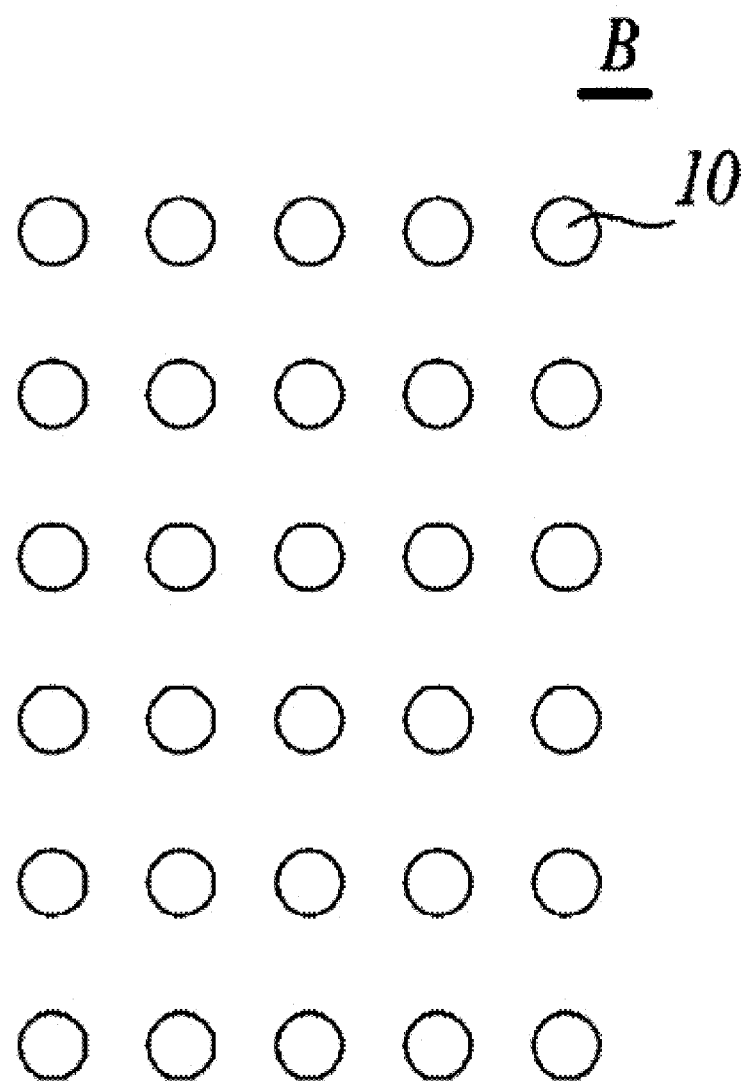

[FIG. 6]
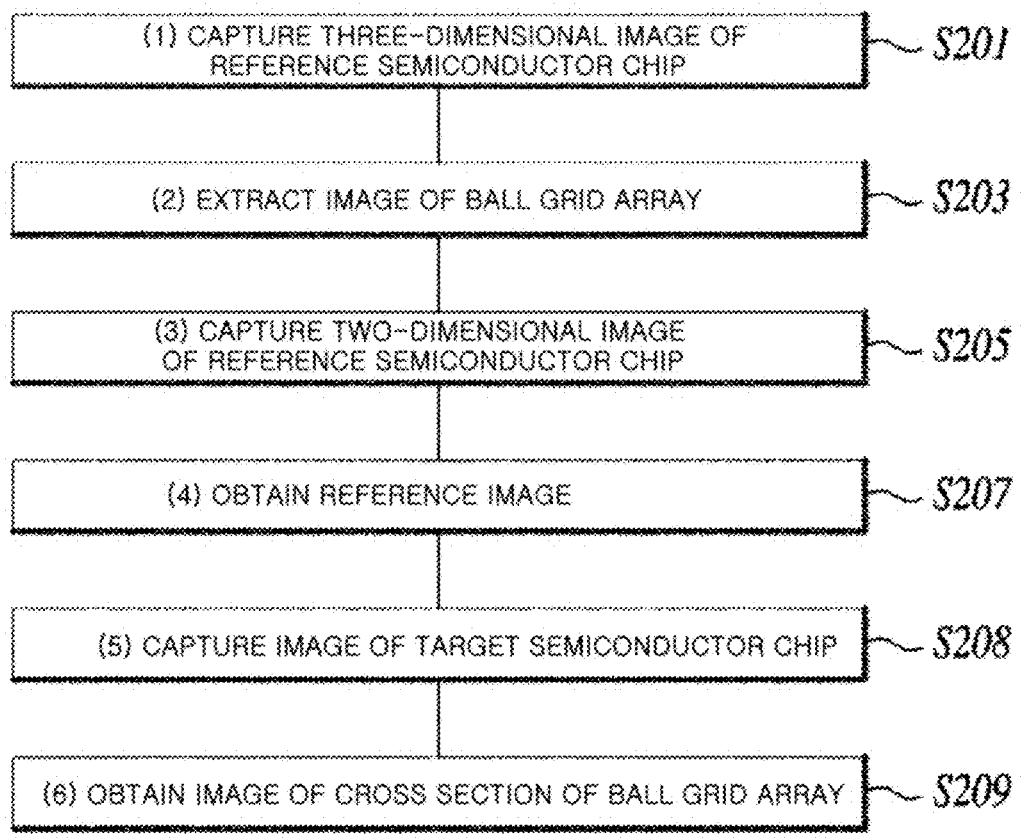

[FIG. 7]
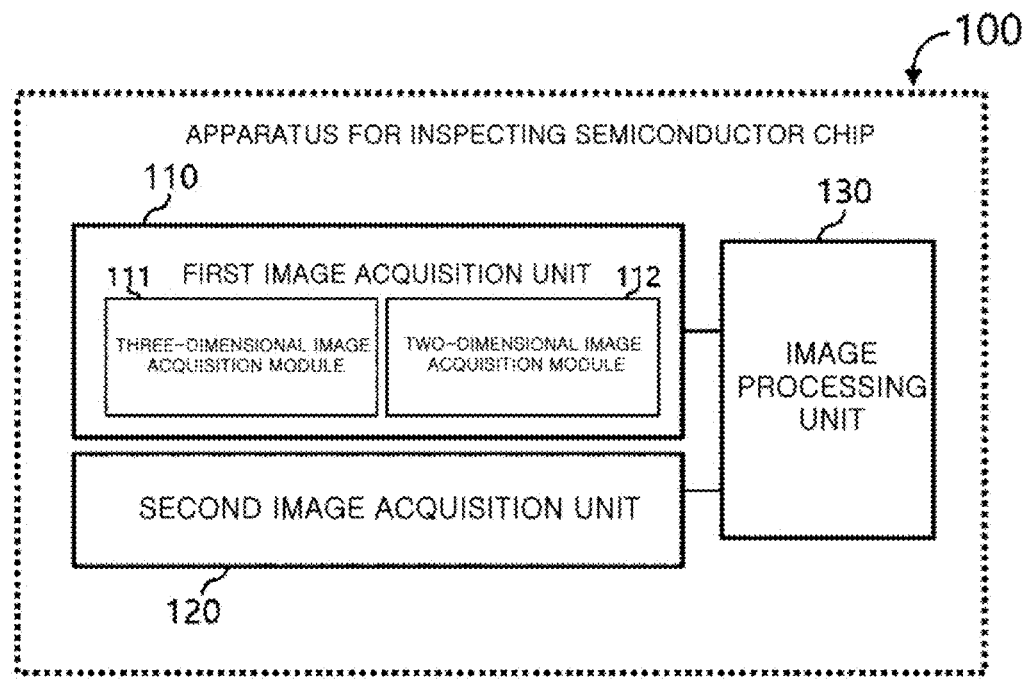
[FIG. 8]
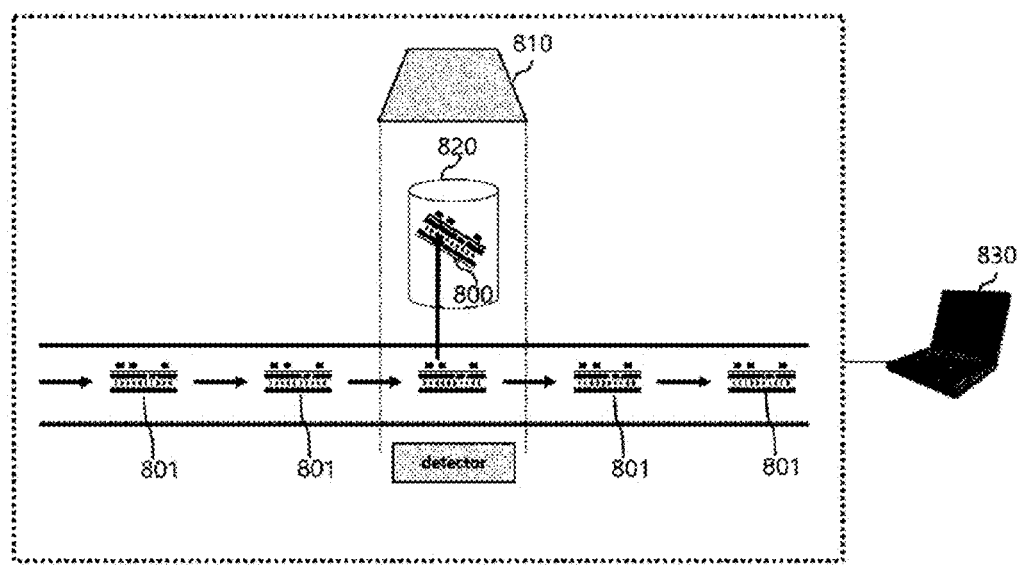

[FIG. 9]
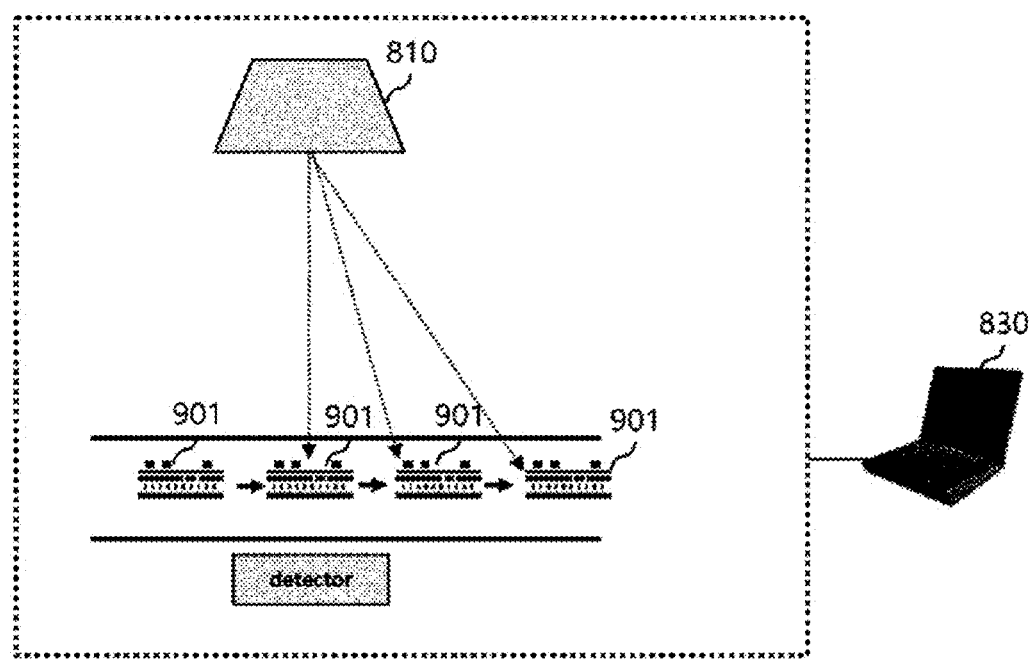

[FIG. 10]
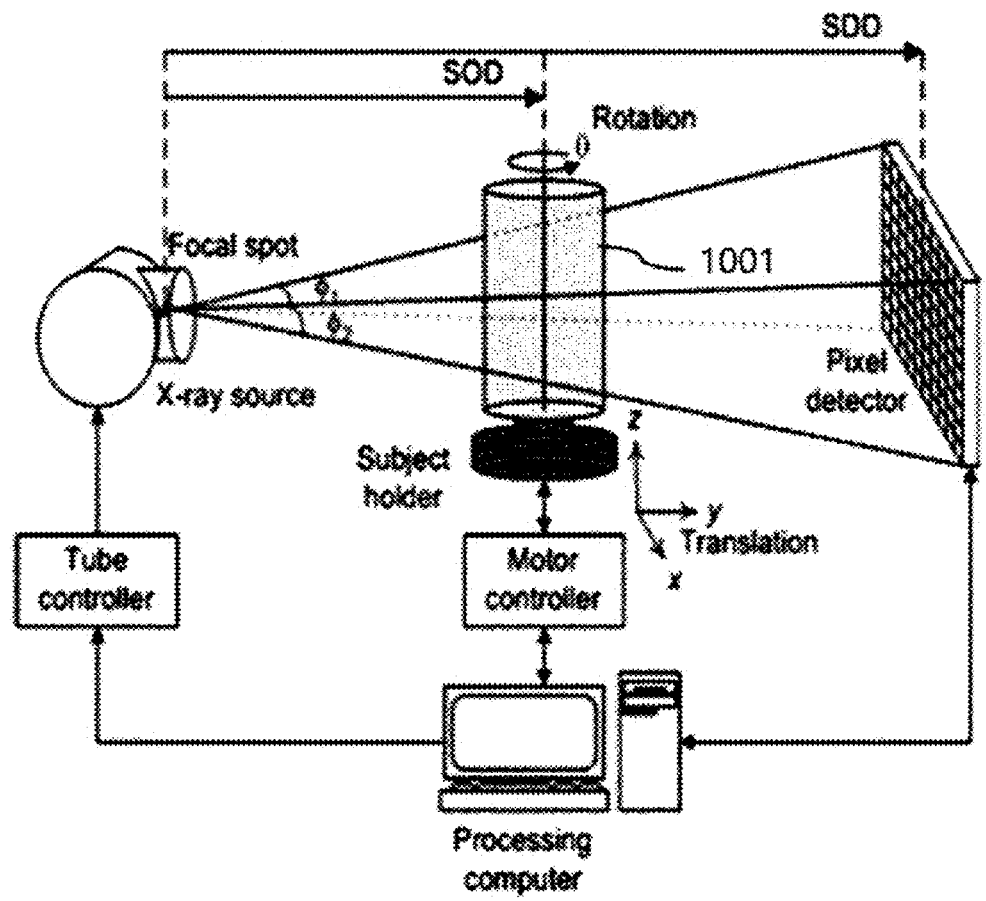

[Fig. 11A]
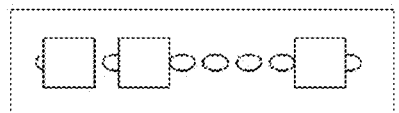
[Fig. 11B]
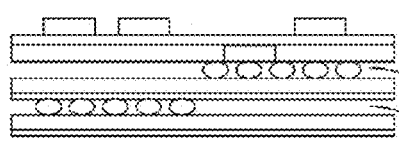
[Fig. 11C]
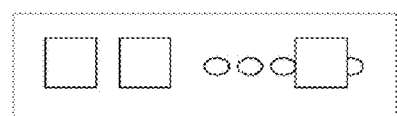
[Fig. 11D]
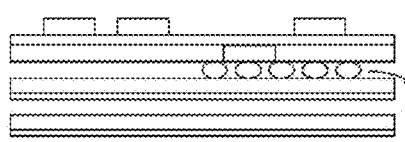
[Fig. 11E]
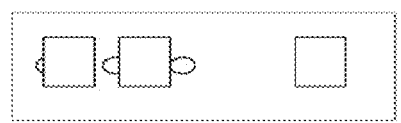
[Fig. 11F]
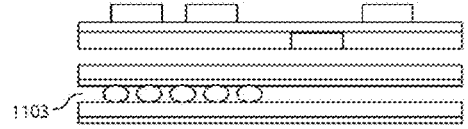
[Fig. 11G]
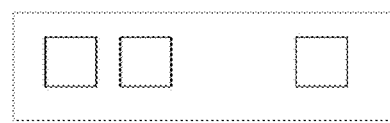
[Fig. 11H]
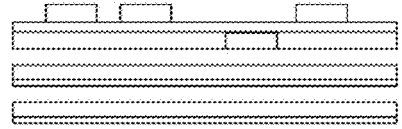
[Fig. 12]
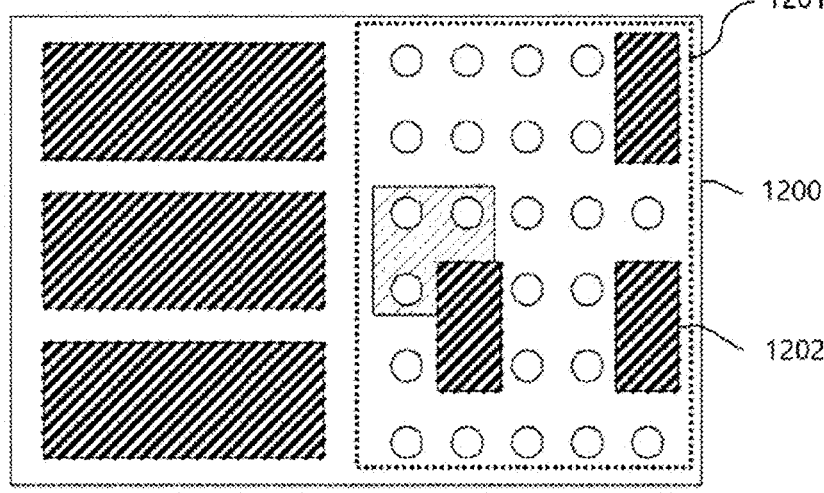

METHOD FOR INSPECTING BALL GRID ARRAY-TYPE SEMICONDUCTOR CHIP PACKAGE

TECHNICAL FIELD

The present invention relates to a method for inspecting a ball grid array (BGA)-type semiconductor chip package, and more particularly, to a method for inspecting a solder ball of a BGA-type semiconductor chip using a nondestructive projection imaging technique.

BACKGROUND ART

With the development of electronics and communication technologies, studies for small size and light weight of electronic devices are actively conducted. Due to this trend, a degree of integration of internal structure of a semiconductor chip necessarily increases. In order to minimize a problem in that a size of a semiconductor chip becomes large in a case in which the number of pins of an integrated circuit of the semiconductor chip is large, a semiconductor chip having a ball grid array (BGA) structure has been practically used. The BGA is derived from a pin grid array (PGA) in which pins are attached to a part or an entirety of one surface of a semiconductor chip in a grid shape. The pins of the PGA are used for transmitting electric signals from the integrated circuit to a printed circuit board to which the chip is attached. In the BGA, the pins are substituted with solder balls attached to a lower surface of a package. That is, the solder balls arrayed in a grid shape in a BGA-type semiconductor chip serve as pins of a component. As the degree of integration of the PGA increases, intervals of the pins decrease, and thus a soldering process is complex, and there is a risk that a short circuit may occur. However, since the package with the BGA is manufactured using an accurate amount of solder, there are advantages in that the above-described problem does not occur, thermal conductivity is high, and a pin inductance is low.

However, there is a disadvantage in that it is very difficult to inspect the BGA-type semiconductor chip for defects. When the BGA-type semiconductor package is attached to the printed circuit board, it is very difficult to inspect for soldering defects. Sizes and intervals of the solder balls vary according to kinds of semiconductor chips. Accordingly, when inspection for defects is performed, positions, intervals, sizes, presence quality, and the like of the solder balls should be checked. Such a process of inspecting the solder balls should be necessarily performed to prevent malfunction of an entire device.

Although the inspection of the BGA may be overcome using an X-ray apparatus and a special microscope, a cost therefor is currently very high. In addition, as information technology (IT) devices become small and are highly integrated, a semiconductor chip with the BGA has a three-dimensional (3D) integrated semiconductor structure extending from mainly a two-dimensional (2D) substrate. Since a 2D semiconductor chip has a BGA formed on a single layer, all the solder balls may be checked with simple 2D image capturing. However, it is more difficult to inspect only a BGA layer disposed in one region of a semiconductor chip having a 3D structure in which a plurality of layers are stacked, that is, not a single layer, due to the development of the semiconductor chip technology as described above. Since the solder balls of the BGA-type semiconductor chip with the 3D structure are hidden by elements of other integrated circuits or overlap solder balls of other layers, a solder ball array cannot be inspected using general image capturing. Accordingly, it has been evaluated that an optical inspection technology is not suitable for inspecting the BGA-type semiconductor chip. In addition, 2D X-ray inspection has a problem in that image quality of a target inspection region is highly degraded due to overlapping images of surrounding structures.

FIGS. 1A-1B are views illustrating a conventional method for inspecting a BGA-type semiconductor chip, wherein FIG. 1A is an image of a BGA region obtained from an image difference from a 2D projection image of a good product and FIG. 1B is a cross section of a 3D image restored using laminography. Referring to FIG. 1A, it is very difficult to obtain a cue for detecting a defect from a BGA image which is a region of interest and which is obtained from the image difference from the 2D projection image of the good product. In FIG. 1A, when the BGA image is the same as that of the good product, a difference value is not generated as in a portion indicated by an arrow, and when sizes thereof are different and there is a void, a difference value is generated. However, as illustrated in the drawing, a 2D imaging technique has disadvantages in that it is difficult to check features of solder balls, and a contrast degree thereof is low. Particularly, since the solder balls positioned at an upper-right end overlap elements of other layers, it is very difficult to check accurate information on the solder balls. Accordingly, a technology has been proposed for obtaining a partial 3D image using a laminography technology so as to obtain a higher quality image of a region of interest than that of a 2D image. FIG. 1B is an example of an image restored using the laminography, and although contrast degree is higher than that of the 2D image, it is still difficult to accurately distinguish other layers and resolution in a depth direction is low. In addition, the method for inspecting with a 3D image using the laminography has problems in that 3D information may not be completely restored fundamentally, and an inspection time period may increase to a level which cannot be compared to that of the method for inspecting with a 2D image.

As another prior art, a computed tomography (CT) method for inspecting (hereinafter, abbreviated as a prior patent) was disclosed in Korean Patent NO. 10-1293532. In the prior patent disclosed the CT method for nondestructively projecting an inside of an electronic element including a semiconductor chip, a plurality of 2D projection images are obtained while the semiconductor chip is rotated 180° or 360° and are reconstituted as a 3D tomography image. The prior patent has a characteristic in which a BGA-type semiconductor chip is set such that an inspecting angle is inclined with respect to an emission direction of an X-ray. However, the prior patent has disadvantages in that a long time period for obtaining 2D projection images and restoring the images is needed as in laminography, and it is difficult to capture images of a chip having a large area with high resolution.

Accordingly, the 2D and 3D image inspection technique of the X-ray, which are proposed to inspect for defects of BGA-type semiconductor chips, have disadvantages. In order to produce high quality devices, inspection for defects is necessary during a manufacturing process, but, since a necessary time period of the 3D imaging inspection technology is much longer than that of the conventional 2D nondestructive inspection, productivity is reduced, and it is difficult to accurately analyze a BGA region of a highly integrated semiconductor chip using 2D imaging.

The applicant invented a method for inspecting a semiconductor chip, wherein 2D and 3D images are used in conjunction to accurately inspect a BGA region and significantly reduce an inspection time period.

DISCLOSURE

Technical Problem

The present invention is directed to a method for inspecting a semiconductor chip in which a cross section of interest of a ball grid array (BGA)-type semiconductor chip package is clearly obtained and a time period of image processing for obtaining the cross section of interest is significantly reduced.

Technical objectives to be realized through the present invention are not limited to the above-described objective, and the other objectives will be clearly understood by those skilled in the art through the following specification.

Technical Solution

A first embodiment of the present invention provides an apparatus for inspecting a semiconductor chip package, the apparatus including a first image acquisition unit configured to obtain a three-dimensional image of a reference semiconductor chip and a reference image in which a region of interest is removed from the three-dimensional image, a second image acquisition unit configured to obtain a two-dimensional image of a target semiconductor chip, and an image processing unit configured to obtain an image of a region of interest of the target semiconductor chip from a difference between the reference image and the two-dimensional image.

The three-dimensional image may be obtained using various methods without particular limitation as long as information on an inside and a surface of a semiconductor chip may be obtained to form a three-dimensional image. For example, a plurality of pieces of information on the inside and the surface of the semiconductor chip may be obtained using an X-ray to form the three-dimensional image. As a specific method, the information on the inside and the surface of the semiconductor chip is obtained by capturing images thereof using an image acquisition method such as an X-ray while the semiconductor chip is rotated or moved at predetermined intervals and the three-dimensional image is formed from the information using software. In this case, the information on the inside and the surface of the semiconductor chip may be some pieces of information thereof.

The term "semiconductor chip" refers to a substrate in which semiconductor elements, various wires, solder, and the like are integrated and may be understood, for example, as a concept including a printed circuit board (PCB) and the like.

The term "region of interest" refers to a region to be inspected or measured for analyzing or the like, and the present invention may be effective when the "region of interest" is a region which is hidden at a lower or middle layer of a device such that a surface of the region is not easy to check through only external inspection.

Meanwhile, the first image acquisition unit may be included in the present apparatus for inspecting a semiconductor chip and configured to obtain the reference image as described above and may also be configured to receive and use a reference image which is already obtained using another method. In the actual implementation, when the latter method is used, an operation of obtaining a reference image is additionally performed, and the reference image is applied to the present apparatus for inspecting a semiconductor chip. For example, in a process line in which the apparatus for inspecting a semiconductor chip is installed, an operation of obtaining the reference image is performed first and a three-dimensional image is obtained through various methods which are not particularly limited, and a region of interest is manually or automatically removed from the 3D image to form a reference image. Next, the reference image may be stored in the first image acquisition unit to be used in the process line.

In the first embodiment of the present invention, the first image acquisition unit may include a three-dimensional image acquisition module, which is configured to use the three-dimensional image of the reference semiconductor chip to remove one or more regions of interest from the three-dimensional image and obtain the reference image, and a two-dimensional image acquisition module, which is configured to obtain the reference image in which the reference image obtained by the three-dimensional image acquisition module is converted to a two-dimensional image at a specific angle.

In the first embodiment of the present invention, the second image acquisition unit may obtain the two-dimensional image of the target semiconductor chip at the specific angle.

In addition, a second embodiment of the present invention provides a method for inspecting a semiconductor chip package, the method including the steps of (x) using a three-dimensional image of a reference semiconductor chip to obtain a reference image in which a region of interest is removed from the three-dimensional image, (y) obtaining a two-dimensional image of a target semiconductor chip, and (z) obtaining an image of a region of interest of the target semiconductor chip from a difference between the reference image obtained in the step (x) and the two-dimensional image of the target semiconductor chip obtained in the step (y).

In the second embodiment of the present invention, the step (x) may be a step of removing one or more regions of interest from the three-dimensional image and obtaining the reference image in which the three-dimensional image from which the one or more regions of interest are removed is converted to a two-dimensional image at a specific angle, and the step (y) may be a step of obtaining the two-dimensional image of the target semiconductor chip at the specific angle.

In addition, a third embodiment of the present invention provides a method for inspecting a semiconductor chip package, the method including the steps of (i) using a three-dimensional image and a two-dimensional image of a reference semiconductor chip to obtain a reference image in which a region of interest is removed from the two-dimensional image, (ii) obtaining a two-dimensional image of a target semiconductor chip, and (iii) obtaining an image of a region of interest of the target semiconductor chip from a difference between the reference image obtained in the step (i) and the two-dimensional image of the target semiconductor chip obtained in the step (ii).

In the third embodiment of the present invention, the step (i) may include a step of obtaining the three-dimensional image of the reference semiconductor chip, extracting the region of interest from the three-dimensional image, and converting the extracted image to the two-dimensional image at a predetermined angle, a step of obtaining, by an apparatus for inspecting a semiconductor chip, the two-dimensional image of the reference semiconductor chip at the predetermined angle, and a step of obtaining, by the apparatus for inspecting a semiconductor chip, the reference image, from which the region of interest is removed, from a difference between the converted two-dimensional image and the two-dimensional image of the reference semiconductor chip, and the step (ii) may include a step of obtaining the two-dimensional image of the target semiconductor chip at the predetermined angle.

In the above-described various embodiments of the present invention, the reference semiconductor chip and the target semiconductor chip may include common regions of interest, and each of the common regions of interest may include an array having a preset form.

In addition, in the above-described various embodiments of the present invention, the array having the preset form may be a ball grid array.

In addition, a fourth embodiment of the present invention provides a system for inspecting a semiconductor chip package, the system including a rotating unit coupled to a reference semiconductor chip so as to rotate the reference semiconductor chip, an image acquisition device configured to obtain a two-dimensional image of a target semiconductor chip at a specific angle and capture an image of the reference semiconductor chip rotated by the rotating unit to obtain a three-dimensional image of the reference semiconductor chip, and an image processor configured to remove a region of interest from the three-dimensional image, obtain a reference image converted to a two-dimensional image at the specific angle, and obtain an image of a region of interest of the target semiconductor chip from a difference between the reference image and the two-dimensional image of the target semiconductor chip.

Advantageous Effects

Recently, since information technology (IT) devices become small and are integrated, integrated semiconductor chips have three-dimensional (3D) structures extending from mainly two-dimensional (2D) substrates. According to the present invention, a ball grid array (BGA)-type semiconductor package having a 3D structure can be rapidly inspected. More specifically, the present invention can perform 3D image capturing once to obtain a reference image and can accurately obtain a region of interest using only a 2D image of a semiconductor chip. As a result, in a case in which a nondestructive inspection technique according to the present invention is applied to reliability inspection of a BGA-type semiconductor chip, a necessary time period can be significantly reduced as compared to that of a conventional 3D imaging technology (using computed tomography (CT) and laminography). In addition, since a cross section of interest obtained in conjunction with the 3D imaging technology does not overlap other cross sections, solder balls can be clearly checked, and thus reliability of inspection can also be improved. As described above, the present invention is a high-speed nondestructive radiation inspection technique suitable for an in-line inspection of a production site and can be actively applied to a system for inspecting for a defect in a process of manufacturing an information technology (IT) device, a device related to Internet of Things (IoT), and an automotive electric product.

Effects of the present invention are not limited to the above-described effects and should be understood to include all effects which may be inferred from the detailed description of the present invention or elements of the present invention described in the claims.

DESCRIPTION OF DRAWINGS

FIGS. 1A-1B are images showing a conventional method for inspecting a ball grid array (BGA)-type semiconductor chip.

FIG. 2 is a flowchart illustrating a method for inspecting a BGA-type semiconductor chip package according to a first embodiment of the present invention.

FIGS. 3A-3B are views illustrating a three-dimensional (3D) image captured from a semiconductor chip for obtaining a reference image in the method for inspecting from FIG. 2.

FIGS. 4A-4B are views illustrating the reference image in which a cross section of interest is removed from the image of FIG. 3.

FIG. 5 is a view illustrating a BGA region which is a cross section of interest is obtained from an image difference between a two-dimensional (2D) image of a target semiconductor chip and the reference image in the method for inspecting from FIG. 2.

FIG. 6 is a flowchart illustrating a method for inspecting a BGA-type semiconductor chip package according to a second embodiment of the present invention.

FIG. 7 is a block diagram illustrating a configuration of an apparatus for inspecting a semiconductor chip package according to a third embodiment of the present invention.

FIG. 8 is a schematic view illustrating a configuration of a system for inspecting a semiconductor chip package according to a fourth embodiment of the present invention.

FIG. 9 is a view for describing a method in which the system for inspecting a semiconductor chip package obtains a 3D image according to the fourth embodiment of the present invention.

FIG. 10 is a view for describing a method of obtaining a 3D reference image of a reference semiconductor chip using a computed tomography (CT).

FIGS. 11A-11H show views illustrating an image of a reference semiconductor chip in a case of a plurality of regions of interest and views illustrating a reference image in which the regions of the interest are removed according to the various embodiments of the present invention.

FIG. 12 is a view for describing a method of obtaining a reference image by cutting only a region of interest of a reference semiconductor chip.

BEST MODES OF THE INVENTION

Hereinafter, the present invention will be described in detail with reference to the accompanying drawings. However, various embodiments of the present invention may be implemented in several different forms and are not limited to embodiments described herein. In addition, the accompanying drawings are only for the purpose of facilitating understanding of the embodiments disclosed herein, the technical spirit described in the specification is not limited to the accompanying drawings, and the present invention should be understood to cover all modifications, equivalents, and alternatives falling within the spirit and scope of the invention. In addition, parts irrelevant to descriptions are omitted in the drawings in order to clearly explain the present invention, sizes and shapes of components illustrated in the drawings are variously changed, and the same/similar parts are denoted by the same/similar reference numerals throughout this specification.

Suffixes such as "module" and "part" for elements used in the following description are given or mixed only in consideration of ease of specification descriptions and do not have their own meanings or roles. In addition, when it is determined that detailed descriptions of related well-known functions and configurations unnecessarily obscure the gist of the invention, the detailed descriptions will be omitted.

Throughout this specification, when a part is referred to as being "connected (in contact with or coupled)" to another part, it includes "directly connected (in contact with or coupled)" and "indirectly connected (in contact with or coupled)" via an intervening part. Also, when a certain part "includes (has or is provided in)" a certain component, other components are not excluded from being included unless explicitly described otherwise, and other components may further be included or provided.

The terminology used herein to describe the embodiments of the present invention is not intended to limit the scope of the present invention. The articles "a," "an," and "the" are singular in that they have a single referent, however the use of the singular form in the present document does not preclude the presence of more than one referent unless the context clearly indicates otherwise. It should be further understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

In addition, it will be understood that, although the terms "first," "second," etc. may be used herein to describe various elements, these elements should not be limited by these terms. These terms are only used for distinguishing one element from another. For example, a first element could be termed a second element, and a second element could similarly be termed a first element without departing from the scope of the present invention.

A method and an apparatus for inspecting a semiconductor chip package, which will be described below, according to various embodiments of the present invention may be applied to semiconductor chip packages having various forms.

First, one embodiment of the present invention may be conceptually described as steps of (x) obtaining a reference image in which a three-dimensional (3D) image of a reference semiconductor chip is used to remove a region of interest from the 3D image, (y) obtaining a two dimensional (2D) image of a target semiconductor chip, and (z) obtaining an image of a region of interest from a difference between the reference image obtained in the step (x) and the 2D image of the target semiconductor chip obtained in the step (y).

The reference semiconductor chip and the target semiconductor chip may include common regions of interest, and such a region of interest may be preset, and the image of the region of interest finally obtained in the step (z) is the image of the region of interest of the target semiconductor chip.

Particularly, the step (x) may be a step of removing one or more regions of interest from the 3D image and obtaining a reference image converted to a 2D image at a specific angle from the 3D image from which images of one or more regions of interest are removed, and the step (y) may be a step of obtaining a 2D image of a target semiconductor chip at the specific angle.

Next, the above-described conceptual description will be described as a first embodiment in detail. For the sake of convenience of description, it will be described that the first embodiment is applied to a ball grid array (BGA)-type semiconductor chip package.

FIG. 2 is a flowchart illustrating a method for inspecting a BGA-type semiconductor chip package according to the first embodiment of the present invention.

Referring to FIG. 2, the method for inspecting a BGA-type semiconductor chip package may include the steps of (a) capturing an image of a reference semiconductor chip (S101), (b) obtaining a reference image (S103), (c) capturing an image of a target semiconductor chip (S105), and (d) obtaining an image of a cross section of a BGA (S107).

In the step (a) of S101, the 3D image of the reference semiconductor chip is obtained. The step (a) of S101 may be performed once or a plurality of times in an actual process so as to form a reference image.

In the step (a) of S101, the 3D image of any one reference semiconductor chip is captured using an X-ray computed tomography (CT). FIGS. 3A-3B are views illustrating a 3D image captured from a semiconductor chip 1 for obtaining a reference image in the method for inspecting from FIG. 2. FIG. 3A is a view illustrating a forward projection of a reference BGA-type semiconductor chip as a result of the step (a) of S101, and FIG. 3B is a side view illustrating the forward projection.

As illustrated in FIGS. 3A-3B, in the step (a) of S101 and the step (c) of S105 which will be described below, since solder balls 10 included in a BGA of the semiconductor chip 1 are not provided in a single layer, and chip elements 30 are integrated below or above the solder balls, an overlapping projection image of the BGA is obtained. That is, the embodiment of the present invention is particularly suitable for inspecting a BGA-type semiconductor chip having a 3D structure.

In the semiconductor chip 1 having the 3D structure, a BGA region B may be formed between a lower substrate C and other elements or a substrate layer A, and thus it is difficult to clearly check a solder ball region B using a general optical image capturing or 2D X-ray method. In the step (b) of S103 according to the present embodiment, a background image from which an image of the solder ball region B is removed is formed as the reference image. The reference image is used as a reference image which may be compared with the 2D image of the target semiconductor chip at high speed.

In the step (b) of S103, the reference image in which the image of the BGA region B is removed from the 3D image obtained in the step (a) of S101 is obtained. FIGS. 4A-4B are views illustrating the reference image in which a cross section of interest is removed from the image of FIG. 3. FIG. 4A is a view illustrating a forward projection in which the image of the BGA region B, which is the cross section of interest, is removed, and FIG. 4B is a side view illustrating the forward projection.

Referring to FIGS. 4A-4B, in the step (b) of S103, a layer, in which the solder balls 10 are present, among stacked layers of an integrated semiconductor chip may be set as the cross section of interest and may be removed. In the present embodiment, the number of the cross sections of interest may be one or more. As the elements are integrated, an array of the solder balls 10 may be formed with one or more layers, and a layer of the elements 30 for which a reliability test is needed may be set as a cross section of interest instead of the array of the solder balls 10. In the step (a) of S101, when the 3D image of the reference semiconductor chip is obtained, a user set a cross section of interest among layers in a direction of a Z axis (height) as necessary. In the step (b) of S103, when the array region B of the solder balls 10 is set as the cross section of interest, the ball grid layer B is removed to obtain the background image excluding the cross section of interest. Next, since the reference image formed as the background image is a 3D image, a conversion process is needed such that the 3D image can be used for producing a compatible image with a 2D image of a target object later.

In the step (b) of S103, the reference image may be obtained by converting an image, in which the image of the BGA region B of the semiconductor chip 1 is removed from the 3D image obtained in the step (a) of S101, to the 2D image at a fixed specific angle. The specific angle described in the present specification is referred to as an angle preset by the user. The 3D image may be converted to the 2D image at the fixed projection angle, and the reference image may be converted to a type of a 2D image in a plan view thereof in which the semiconductor chip 1 is viewed from above as illustrated in FIG. 4A.

In the step (c) of S105, the 2D image of the target semiconductor chip is obtained. In the step (c) of S105, the 2D image of the target semiconductor chip may be obtained at a specific angle. In the step (c) of S105, the image of target semiconductor chip is captured using a 2D X-ray at an angle which is the same as the above-described specific angle in the reference image conversion process. Plan views of FIGS. 3 to 5 are forward projections of the semiconductor chip 1 viewed from above and example projection images in which the specific angle is set.

In the step (d) of S107, the 2D image corresponding to the BGA region B of the target semiconductor chip 1 is obtained from a difference between the reference image and the 2D image obtained in the step (c) of S105. In the step (d) of S107, an image process of removing the overlapping background image by removing the 2D reference image from the 2D image of the target semiconductor chip and obtaining only the cross section of interest is performed. When considering that the image of the target object is captured by the 2D x-ray and that the image process of the 2D image may be quickly performed, the method for inspecting according to the present embodiment may significantly reduce a time period for inspecting reliability of a BGA-type semiconductor chip.

FIG. 5 is a view illustrating the BGA region which is the cross section of interest obtained from an image difference between the 2D image of the target semiconductor chip and the reference image, which is resulted from the performance of the step (d) of S107. Referring to FIG. 5, the clear image of the BGA region B of the semiconductor chip having a 3D structure may be captured by performing the step (d) of S107.

Here, the step (x) corresponds to the above described step (a) of S101 and step (b) of S103, the step (y) corresponds to the above-described step (c) of S105, the step (z) corresponds to the step (d), and although the descriptions of the corresponding steps are different, meanings thereof may be the same.

Next, a second embodiment will be described. The second embodiment may be conceptually described as the steps of (i) using a 2D image and a 3D image of a reference semiconductor chip to obtain a reference image in which a region of interest is removed from the 2D image, (ii) obtaining, by an apparatus for inspecting a semiconductor chip, a 2D image of a target semiconductor chip, and (iii) obtaining an image of a region of interest from a difference between the reference image obtained in the step (i) and the 2D image of the target semiconductor chip obtained in the step (ii).

The reference semiconductor chip and the target semiconductor chip may have a common region of interest, and such a region of interest may be preset, and the image of the region of interest finally obtained in the step (iii) is the image of the region of interest of the target semiconductor chip.

Particularly, the step (i) may include a step of obtaining a 3D image of a reference semiconductor chip, extracting a region of interest from the 3D image, and converting the extracted image to a 2D image at a predetermined angle, a step of obtaining, by the apparatus for inspecting a semiconductor chip, a 2D image of the reference semiconductor chip at the predetermined angle, and a step of obtaining, by the apparatus for inspecting a semiconductor chip, a reference image, from which the region of interest is removed, from a difference between the converted 2D image and the 2D image of the reference semiconductor chip, and the step (ii) may be a step of obtaining a 2D image of a target semiconductor chip at the predetermined angle.

Next, the above-described conceptual description will be described as the second embodiment in detail. For the sake of convenience of description, it will be described that the second embodiment is applied to a BGA-type semiconductor chip package.

FIG. 6 is a flowchart illustrating a method for inspecting a BGA-type semiconductor chip package according to the second embodiment of the present invention.

Referring to FIG. 6, the method for inspecting a BGA-type semiconductor chip package according to the second embodiment of the present invention may include the steps of (1) capturing a 3D image of a reference semiconductor chip (S201), (2) extracting an image of a BGA region (S203), (3) capturing a 2D image of the reference semiconductor chip (S205), (4) obtaining a reference image (S207), (5) capturing an image of a target semiconductor chip (S208), and (6) obtaining an image of a cross section of a BGA (S209).

In the step (1) of S201, the 3D image of the reference semiconductor chip may be obtained. In the step (1) of S201, the 3D image of any one reference semiconductor chip is captured using an X-ray CT. The step (1) of S201 corresponds to the above-described step (a) of S101, and an image of FIG. 3 may be obtained in the step (1) of S201.

In the step (2) of S203, the image corresponding to the BGA region B may be extracted from the 3D image obtained in the step (1) of S201. The step (2) of S203 is a step of obtaining a reference image with the step (3) of S205 and the step (4) of S207 described below. In the present embodiment, only the BGA region B, which is a region of interest, is extracted from the 3D image unlike the embodiment of FIG. 2 from which the region of interest is removed.

In the step (3) of S205, the 2D image of the reference semiconductor chip may be obtained. That is, in the present embodiment, the reference image is obtained by capturing the 3D and 2D images of the reference semiconductor chip unlike the embodiment of FIG. 2.

In the step (4) of S207, the reference image from which the BGA region is removed may be obtained from a difference between the 2D image obtained in the step (3) of S205 and the image extracted in the step (2) of S203. In this step, since the image obtained in the step (3) of S205 is a 2D image, and the image obtained in the step (2) of S203 is a 3D image, an image conversion process is needed to process both of the images.

In the step (4) of S207, the 3D image of the BGA region extracted in the step (2) of S203 may be converted to the 2D image at a specific angle, and the converted 2D image may be removed from the 2D image obtained in the step (3) of S205.

That is, the embodiment of FIG. 6 may be understood as another embodiment of the step (b) of S103 of obtaining the reference image of FIG. 2. In the embodiment of FIG. 6, a region of interest is extracted to obtain a reference image. In the embodiments of FIGS. 2 and 6, image processing processes (removing or extracting of a cross section of interest) of the step (b) of S103 and the step (2) of S203 may be directly required to the user. The user may selectively perform the embodiment of the FIG. 2 or 6 according to a case in which a region of interest is easily extracted from a 3D image or the region of interest is easily removed therefrom.

In the step (5) of S208, the 2D image of the target semiconductor chip may be obtained. In the step (5) of S208, the 2D image of the target semiconductor chip at the specific angle may be obtained. The step (5) of S208 corresponds to the step (c) of S105, and repeated descriptions thereof will be omitted.

In the step (6) of S209, the 2D image corresponding to the cross section of the BGA region of the target semiconductor chip may be obtained from a difference between the reference image and the 2D image obtained in the step (5) of S208. The step (6) of S209 corresponds to the above-described step (d) of S107, and the repeated descriptions will be omitted.

Here, the step (i) may correspond to the above-described step (1) of S201 to step (4) of S207, the step (ii) may correspond to the above-described step (5) of S208, and the step (iii) may correspond to the above-described step (6) of S209. Although the descriptions of the corresponding steps are different, meanings thereof may be the same.

FIG. 7 is a block diagram illustrating a configuration of an apparatus 100 for inspecting a semiconductor chip package according to a third embodiment of the present invention. The apparatus 100 for inspecting a semiconductor chip package includes a first image acquisition unit 110, a second image acquisition unit 120, and an image processing unit 130.

The first image acquisition unit 110 uses a 3D image of a reference semiconductor chip to obtain a reference image in which a region of interest is removed from the 3D image.

The second image acquisition unit 120 obtains a 2D image of a target semiconductor chip.

The image processing unit 130 obtains an image of the region of interest from a difference between the reference image and the 2D image.

The reference semiconductor chip and the target semiconductor chip may include common regions of interest, such a region of interest may be preset, the image of the region of interest finally obtained by the image processing unit 130 may be the image of the region of interest of the target semiconductor chip.

The reference semiconductor chip and the target semiconductor chip may include arrays (for example, BGAs) having predetermined forms, and the common regions of interest may be regions in which the arrays having the above-described preset forms are formed.

Specifically, the first image acquisition unit 110 may include a 3D image acquisition module 111 configured to obtain a 3D image of a reference semiconductor chip and remove one or more regions (or cross sections) of interest from the 3D image to obtain a reference image, and a 2D image acquisition module 112 configured to obtain a reference image in which the reference image obtained by the 3D image acquisition module 111 is converted to a 2D image at a specific angle.

In a case in which the 2D image acquisition module 112 obtains a reference image converted to a 2D image at a specific angle, the second image acquisition unit 120 may obtain a 2D image of a target semiconductor chip at an angle which is the same as the above-described specific angle.

Accordingly, the image processing unit 130 may obtain an image of a region of interest of a target semiconductor chip from a difference between a reference image converted to a 2D image at a specific angle and a 2D image of the target semiconductor chip at an angle which is the same as the above-described specific angle.

Unlike the above-described description, the first image acquisition unit 110 may also obtain 3D and 2D images of a reference semiconductor chip and obtain a reference image in which a region of interest is removed from the 3D and 2D images of the reference semiconductor chip. In this case, the second image acquisition unit 120 may obtain a 2D image of a target semiconductor chip, and the image processing unit 130 may obtain an image of a region of interest of the target semiconductor chip from a difference between the reference image and the 2D image of the target semiconductor chip.

In addition, the above-described 3D image acquisition module 111 may obtain 3D and 2D images of a reference semiconductor chip and extract and obtain an image of a region of interest from the 3D image, and the above-described 2D image acquisition module 112 may convert the image of the region of interest to a 2D image at a predetermined angle and obtain a reference image, in which the region of interest is removed, from a difference between the converted 2D image and the 2D image of the reference semiconductor chip at an angle which is the same as the above-described predetermined angle.

Accordingly, the image processing unit 130 may obtain an image of the region of interest of the target semiconductor chip from a difference between the reference image converted to the 2D image at the predetermined angle and the 2D image of the target semiconductor chip at an angle which is the same as the above-described predetermined angle.

The first image acquisition unit 110, the second image acquisition unit 120, and the image processing unit 130 included in the apparatus 100 for inspecting a semiconductor chip package described with reference to FIG. 7 may be individually formed or coupled as a single unit.

The apparatus 100 for inspecting a semiconductor chip package described above with reference to FIG. 7 may be used for the method for inspecting a semiconductor chip package illustrated in FIGS. 2 and 6. That is, the method for inspecting a semiconductor chip package according to the first embodiment or second embodiment of the present invention illustrated in FIG. 2 or 6 may be performed using the apparatus 100 for inspecting a semiconductor chip package.

Specifically, the step (a) of S101, the step (b) of S103, and the step (x) which are described above with reference to FIG. 2, the step (1) of S201 to the step (4) of S207 and the step (i) which are described with reference to FIG. 6 will be performed using the first image acquisition unit 110 included in the apparatus 100 for inspecting a semiconductor chip package.

In addition, the above-described steps (c), (y), (5), and (ii) may be performed by the second image acquisition unit 120, and the above-described steps (d), (z), (6), and (iii) may be performed by the image processing unit 130.

The reference semiconductor chip and the target semiconductor chip which are described in the present specification may be semiconductor chips manufactured through the same or similar manufacturing processes. In addition, as described above, the reference semiconductor chip and the target semiconductor chip may include common regions of interest, and the common regions of interest may include arrays having preset forms. In addition, the arrays having the preset forms may be BGAs including one or more solder balls but are not necessarily limited to the BGAs.

FIG. 8 is a schematic view illustrating a configuration of a system for inspecting a semiconductor chip package according to a fourth embodiment of the present invention.

Referring to FIG. 8, the system for inspecting a semiconductor chip package may include an image acquisition device 810, which is formed to view a moving unit 802 or a target semiconductor chip 801 from above the moving unit 802 when the target semiconductor chip 801 moves on the moving unit 802, and a rotating unit 820, which is configured to rotate a reference semiconductor chip such that the image acquisition device 810 obtains a 3D reference image of the reference semiconductor chip 800.

In addition, the system for inspecting a semiconductor chip package may further include an image processor 830 configured to receive an image obtained by the image acquisition device 810 to form an image of a region of interest of a target semiconductor chip, and the like.

The image processor 830 may be provided in a type of a personal computer (PC) such as a notebook but does not need to be formed in an independent apparatus and may be formed as an apparatus which is subordinate to the image acquisition device 810 or rotating unit 820.

The image acquisition device 810 may obtain a 2D image (image of a cross section or tomography) of a target semiconductor chip which moves on the moving unit 802.

In addition, the rotating unit 820 may be coupled to a specific semiconductor chip 801 among target semiconductor chips 801 which move on the moving unit 802 to form a reference semiconductor chip or may be coupled to a separate reference semiconductor chip 800.

For example, in a case in which the rotating unit 820 is coupled to the specific semiconductor chip 801 among the target semiconductor chips 801 which move on the moving unit, the system for inspecting a semiconductor chip package may obtain a reference image from the specific semiconductor chip 801.

In addition, the rotating unit 820 may include a motor and the like to vertically or laterally rotate the reference semiconductor chip 800.

When the rotating unit 820 rotates the reference semiconductor chip 800, the image acquisition device 810 may obtain a plurality of 2D images of the reference semiconductor chip 800, and a 3D image of the reference semiconductor chip 800 from the obtained plurality of 2D images.

An angle by which the rotating unit 820 rotates the reference semiconductor chip 800, a rotating time for which the rotating unit 820 rotates the reference semiconductor chip 800, a time period for which the image acquisition device 810 captures an image of the reference semiconductor chip 800, the number of instances of image capturing, and an angle at which the image acquisition device 810 captures the image may be variously changed.

Like the apparatus 100 for inspecting a semiconductor chip package illustrated in FIG. 7, the method for inspecting a semiconductor chip package according to the first embodiment or second embodiment of the present invention illustrated in FIG. 2 or 6 may also be performed using the system for inspecting a semiconductor chip package illustrated in FIG. 8.

For example, the system for inspecting a semiconductor chip package illustrated in FIG. 8 may obtain a 3D image of a reference semiconductor chip and a 2D image of a target semiconductor chip using the image acquisition device 810 and the rotating unit 820. In addition, the system for inspecting a semiconductor chip package may use the image processor 830 to remove a region of interest from the 3D image, convert the 3D image to a 2D image at a specific angle, and obtain an image of a region of interest of the target semiconductor chip from a difference between the converted 2D reference image and the 2D image of the target semiconductor chip.

A conventional general system for inspecting a semiconductor chip package includes a moving unit, which is configured to move an inspection target semiconductor chip, and an image capturing device (for example, an X-ray image capturing device), which is provided above the moving unit to capture an image (of a cross section or a tomography) of the moving inspection target semiconductor chip.

Accordingly, when only the rotating unit 820 illustrated in FIG. 8 is applied to the conventional general system for inspecting a semiconductor chip package, a system for inspecting a semiconductor chip package may be formed. That is, the system for inspecting a semiconductor chip package may be formed using the conventional system for inspecting a semiconductor chip package without changing.

FIG. 9 is a view for describing a method in which a system for inspecting a semiconductor chip package obtains a 3D image of a reference semiconductor chip 901 according to the fourth embodiment of the present invention illustrated in FIG. 8.

In the descriptions described with reference to FIG. 8, a method in which the system for inspecting a semiconductor chip package obtains a 3D image of the reference semiconductor chip 800 using the rotating unit 820 and the image acquisition device 810 is described.

Alternatively, the system for inspecting a semiconductor chip package may obtain a 3D image of a reference semiconductor chip only using the image acquisition device 810 without the rotating unit 820.

Referring to FIG. 9, when a reference semiconductor chip 901 which moves on the moving unit arrive at a region in which the image acquisition device 810 may capture images of the reference semiconductor chip 901, the image acquisition device 810 may sequentially capture the images of the reference semiconductor chip 901 which is moving at predetermined intervals and may obtain the 2D images of the reference semiconductor chip 901 captured at various angles.

Accordingly, a 3D image of the reference semiconductor chip 901 may be obtained using the 2D images of the reference semiconductor chip 901 captured at the various angles, and in this case, the 3D image of the reference semiconductor chip 901 may be obtained even when the reference semiconductor chip 901 is not rotated.

FIG. 10 is a view for describing a method of obtaining a 3D reference image of a reference semiconductor chip using a CT.

Although the system for inspecting a semiconductor chip package includes the rotating unit 820 such that the image acquisition device 810 obtains the 3D image of the reference semiconductor chip, alternatively, a 3D reference image of a reference semiconductor chip 1001 may be obtained using a CT apparatus in the present embodiment.

That is, a system for inspecting a semiconductor chip package according to still another embodiment of the present invention may include the image acquisition device 810 and the image processor 830 which are illustrated in FIG. 8 and a CT apparatus. The system for inspecting a semiconductor chip package may obtain a 3D image of the reference semiconductor chip 1001 using the CT apparatus illustrated in FIG. 10, and the obtained 3D image may be stored in a separately provided database (not shown). Since other processes are described above, the descriptions thereof will be omitted.

FIGS. 11A-11H show views illustrating an image of a reference semiconductor chip in a case of a plurality of regions of interest and views illustrating a reference image in which the regions of interest are removed according to the various embodiments of the present invention.

Even in a case of a plurality of images of regions (cross sections) of interest, the images of the regions of interest may be obtained using the method, the apparatus, and the system for inspecting a semiconductor chip package according to various embodiments of the present invention described with reference the FIGS. 1 to 10.

For example, in a reference image from which a region of interest of a reference semiconductor chip, which is obtained in the above-described step (x), or step (i), or through the first image acquisition unit 110, is removed, the region of interest may include a plurality of regions 1101 and 1103 as illustrated in FIGS. 11A and 11B. Although two regions 1101 and 1103 of interest are illustrated in FIGS. 11A-11H for the sake of convenience of description, there may be two or more regions of interest.

FIG. 11A is a view illustrating a forward projection of a 3D image of a reference semiconductor chip obtained in the above-described step (x), or step (i), or through the first image acquisition unit 110, and FIG. 11B is a side view illustrating the forward projection.

FIG. 11C is a view illustrating a forward projection of a 3D reference image from which the region 1103 of two regions 1101 and 1103 of interest obtained in the above-described step (x), or step (i), or through the first image acquisition unit 110 is removed, and FIG. 11D is a view illustrating a side surface of the forward projection.

FIG. 11E is a view illustrating a forward projection of a 3D reference image from which the region 1101 of two regions 1101 and 1103 of interest obtained in the above-described step (x), or step (i), or through the first image acquisition unit 110 is removed, and FIG. 11F is a view illustrating a side surface of the forward projection.

FIG. 11G is a view illustrating a forward projection of a 3D reference image from which both the regions 1101 and 1103 of interest, which are obtained in the above-described step (x), or step (i), or through the first image acquisition unit 110, are removed, and FIG. 11H is a view illustrating a side surface of the forward projection.

As described above, a plurality of regions (cross sections) of interest of a target semiconductor chip may also be obtained using the steps, functions, and components of the method, apparatus, and system for inspecting a semiconductor chip package according to the various embodiments of the present invention described above with reference to FIGS. 1 to 10.

For example, the step (x) of the method for inspecting a semiconductor chip package according to the first embodiment of the present invention described with reference to FIG. 2 may be a step of obtaining a 3D image of a reference semiconductor chip, removing at least any one region of first and second regions of interest from the 3D image, and obtaining a reference image in which the 3D image is converted to a 2D image at a specific angle.

Here, the step (y) may be a step of obtaining a 2D image of a target semiconductor chip at a specific angle which is the same as the specific angle, the step (z) may be a step of obtaining at least any one image of the first and second regions of interest of the target semiconductor chip from a difference between the reference image obtained in the step (x) and the 2D image of the target semiconductor chip obtained in the step (y).

Similarly, the first image acquisition unit 110 of the apparatus 100 for inspecting a semiconductor chip package according to the third embodiment of the present invention illustrated in FIG. 7 may use (or obtain) a 3D image of a reference semiconductor chip, remove at least one region of interest from the 3D image, and form a reference image in which the 3D image is converted to a 2D image at a specific angle.

In addition, here, the second image acquisition unit 120 may obtain the 2D image of the target semiconductor chip at a specific angle which is the same as the specific angle, and the image processing unit 130 may obtain at least one image of the region of interest of the target semiconductor chip from a difference between the reference image and the 2D image of the target semiconductor chip.

As illustrated in FIGS. 11A-11H, when the method, the apparatus, and the system for inspecting a semiconductor chip package according to various embodiments of the present invention are used, an excellent effect of inspecting only an array of a target layer in a semiconductor chip having a structure in which a plurality of arrays having specific forms are stacked can be achieved.

FIG. 12 is a view for describing a method of obtaining a reference image by cutting only a region of interest of a reference semiconductor chip.

In the embodiment described with reference to FIGS. 8 and 10, the method in which the 3D image or 3D reference image of the entire reference semiconductor chip is obtained is used, but in an embodiment which will be described below, a 3D image or 3D reference image of only a region of interest of a reference semiconductor chip may be obtained.

Referring to FIG. 12, a reference semiconductor chip 1200 includes a region 1201 which is a region of interest and a region 1202 which is not a region of interest. Accordingly, the region 1201 which is the region of interest may be cut from the reference semiconductor chip 1200 to obtain a 3D image or 3D reference image of the region 1201.

In such a method, since the entire reference semiconductor chip is not rotated, and only the region which is the region of interest may be rotated, efficiency thereof may be higher than that of the method of obtaining the 3D image described with reference to FIGS. 8 and 10 in a viewpoint of a space.

As described above, the region 1201 which is the region of interest illustrated in FIG. 12 may be a region in which an array having a preset form is formed, and the array having the preset form may have a form of a BGA including at least one solder ball but may have another form.

In the present specification, a method of removing a region of interest from a 3D image of a reference semiconductor chip may be a method of setting the region of interest using the 3D image of the reference semiconductor chip and setting a pixel value of the region of interest to zero, but various methods may be used as the method in addition thereto.

In addition, in the present specification, a technique of removing a reference image converted to a 2D image at an angle, which is the same as a specific angle, from a 2D image of a target semiconductor chip at the specific angle may use a method of obtaining difference by removing an image from another image using the simple four fundamental arithmetic operations, but various methods may be used for the technology.

A region of interest may be automatically set using a preset algorithm or software, and a pixel value of the region of interest may be set to zero, or the region of interest may be manually set and a pixel value of the region of interest may be set to zero.

Hereinafter, an example of a method of comparing a 2D reference image (hereinafter, referred to as a "2D reference image") converted from a 3D reference image of a reference semiconductor chip according to the above-described various embodiments of the present invention and a 2D image (hereinafter, referred to as a "2D target image") of a target semiconductor chip will be described.

In a case in which a region (cross section) of interest of a target semiconductor chip is determined according to the various embodiments of the present invention, a case in which a 2D image is obtained at a position which is different from a position of a 2D reference image which is a 2D image converted from a 3D reference image at a specific angle may occur due to an influence of a surrounding environment.

In this case, a position of an inspection target positioned in the 2D target image is different from a position of an inspection target positioned in a region of interest in the 2D reference image. As a result, an image of the region of interest may not be accurately obtained from a difference between the 2D reference image and the 2D target image.

Accordingly, in the various embodiments of the present invention, the above-described problem may be compensated by comparing similarity (using mutual information and a normalized correlation coefficient (NCC)) to determine whether a 2D target image and a 2D reference image are obtained at the same angle or from the same direction.

When a result value of similarity comparison is a predetermined value or more, a process of obtaining an image of a region of interest from a difference between a 2D reference image and a 2D target image according to the above-described various embodiments of the present invention without changing, and otherwise, a process of reobtaining a 2D reference image from a 3D reference image at another angle (from another direction) may be performed according to the various embodiments of the present invention.

Mutual information, an NCC, and the like may be used to measure similarity between images.

A comparing method of using mutual information is a method of comparing values stored in pixels included in two images to determine how many pieces of common information are included in the two images. When two images A and Y are given to calculate mutual information, mutual information 1 may be calculated using the following Equation 1.

$$I(X;Y) = \sum_{y \in Y} \sum_{x \in X} p(x,y) \log\left(\frac{p(x,y)}{p(x)p(y)}\right) \quad \text{Equation 1}$$

In Equation 1, p(x,y) is a joint probability of pixel values of the images X and Y, and p(x) and p(y) are marginal probabilities of pixel values of the images. Equation 1 may be shown as the following Equation 3 using entropy defined by the following Equation 2.

$$H(x) = \sum_i p(x_i) \log_b p(x_i) \quad \text{Equation 2}$$

$$I(X;Y) = H(X) + H(Y) - H(X,Y) \quad \text{Equation 3}$$

In Equation 2, $p(x_i)$ may be calculated using a histogram of an image at a probability at which a pixel value of the image X is $x_i$. In addition, a base b of a logarithm in Equation 2 may be selectively changed by a user, but 2 or 10 is generally used.

A calculation process from Equation 1 to Equation 3 may be shown as the following Proof 1.

$$\begin{aligned}
I(X;Y) &= \sum_{x,y} p(x,y) \log \frac{p(x,y)}{p(x)p(y)} \quad \text{Proof 1}\\
&= \sum_{x,y} p(x,y) \log \frac{p(x,y)}{p(x)} - \sum_{x,y} p(x,y) \log p(y) \\
&= \sum_{x,y} p(x)p(y|x) \log p(y|x) - \sum_{x,y} p(x,y) \log p(y) \\
&= \sum_{x} p(x) \left( \sum_{y} p(y|x) \log p(y|x) \right) - \sum_{y} \log p(y) \left( \sum_{x} p(x,y) \right) \\
&= -\sum_{x} p(x) H(Y|X=x) - \sum_{y} \log p(y) p(y) \\
&= -H(Y|X) + H(Y) \\
&= H(Y) - H(Y|X)
\end{aligned}$$

In addition, similarity of two images may be measured using an NCC. A value R of the NCC may be calculated using the following Equation 4.

$$R = \frac{\sum_{x',y'} X(x',y') Y(x',y')}{\sqrt{\sum_{x',y'} X(x',y')^2 \sum_{x',y'} Y(x',y')^2}} \quad \text{Equation 4}$$

In Equation 4, X and Y are images for obtaining similarity, and x' and y' are indexes of pixels included the images.

On the basis of the above-described result of the similarity, it may be determined whether a 2D reference image and a 2D target image are arranged at die same position or are viewed at the same angle, and the corresponding images may be arranged. In order to arrange the images, a transformation parameter for transforming the images has to be obtained.

A typical method for obtaining a transformation parameter to arrange images includes a method for optimization using differentiation of a measurement value of similarity or a linear method for optimization without using differentiation.

First, a typical optimization method using a differential includes a stochastic gradient descent (SGD) method. In order to use this method, a differential value of previously measured similarity has to be calculated. Although an equation for calculating the similarity may be directly differentiated, since a pixel value may be changed in a case in which transformation is applied, differentiation may be preferably calculated using finite difference $$\frac{\partial I(X, Y(T(u)); u)}{\partial u_i} = \frac{I(X, Y(T(u)); u_i + h) - I(X, Y(T(u)); u_i)}{h} \quad \text{Equation 5}$$

In Equation 5, I(X,Y(T(u));u) is a similarity value between an image Y, which is converted using a transformation parameter u, and an image X, and ui is one parameter for converting an image. Generally, three parameters are used for converting a 2D image, and six parameters are used for converting a 3D image.

After differentiation of each of the parameters is calculated, the transformation parameter is updated using the following Equation 6. Here, α is a value for determining how much the transformation parameter is updated and is generally referred to as a step size or learning rate.

$$u_i = u_i + \alpha * \frac{\partial I(X, Y(T(u)); u)}{\partial u_i} \quad \text{Equation 6}$$

When the update is performed using the above-described method, since a differentiation value of similarity approaches zero at a point at which the similarity between the images X and Y is maximum, an image conversion parameter for an optimum similarity may be obtained.

However, since there may be a section in which a slope of similarity increases without decreasing as similarity increases according to a similarity measurement method, when the method using differentiation is used, an optimum parameter may not be accurately calculated. In order to prevent such a phenomenon, a linear optimization method, which does not use differentiation, has to be used. Powell's method, which is one of linear optimization methods, may include the following steps ① to ④.

In step ①, n different directions of n parameters are initialized, and in step ②, positions at which similarity is maximum is determined while the parameters are changed in the n different directions to update the parameters. In step ③, after the parameters are updated in the n different directions, the parameters and vectors of the parameters input in the step ② are calculated to add new directions, and in step ④, the steps ② and ③ are repeated until the parameters are not updated because the similarity is sufficiently high.

In addition, in order to obtain a 2D reference image from a 3D reference image in a different direction (or at a different angle), it has to be determined how much difference is present between a target semiconductor chip and a reference semiconductor chip. To this end, a method used for image registration is used according to the various embodiments of the present invention.

First, while a 3D reference image is rotated, a 2D reference image is obtained, and similarity between the obtained 2D reference image and a 2D image of a target semiconductor chip is calculated. The 3D reference image is continuously rotated or moved to maximize a value of the similarity to find an optimum parameter.

However, when in a case in which the 3D reference image is continuously rotated to find the optimum parameter without an initial condition, a time period for which the parameter is calculated may be long. Accordingly, in order to reduce the calculation time period, a method below may be used.

First, 3D reference images are obtained within a range in which a target semiconductor chip may rotate and are stored in a separate database. Next, when it is determined that a position of an inspection target positioned in a 2D target image is different from a position of an inspection target positioned in a region of interest of a 2D reference image, the 2D target image is compared with the reference images stored in the database to find a position of the most similar 3D reference image, and a position of the 3D reference image is optimized using the position as an initial condition. Here, a method of using a gradient (gradient descent), performing linear optimization (Powell's method), and the like may be used for optimization.

Meanwhile, in a process of actually inspecting a BGA-type semiconductor chip, there is a case in which BGA-type semiconductor chips having the same form are inspected in process lines, and there is also a case in which BGA-type semiconductor chips having different forms are inspected. In the latter case, reference images of the BGA-type semiconductor chips may be stored and the reference images may be selectively used according to the form of the semiconductor chip when the process is performed.

Meanwhile, the present invention may be applied to automotive parts, semiconductor components, electronic components, and the like in addition to semiconductor chips, may check forms which are not easy to externally check, and may check regions of interest in which defects such as open, bridge, short, high soldering, misalign, cold soldering, various soldering defects, and the like may occur.

The above description is only exemplary, and it will be understood by those skilled in the art that the invention may be performed in other concrete forms without changing the technological scope and essential features. Therefore, the above-described embodiments should be considered as only examples in all aspects and not for purposes of limitation. The scope of the present invention is defined by the appended claims and encompasses all modifications or alterations derived from meanings, the scope and equivalents of the appended claims.

MODES OF THE INVENTION

Modes of the invention have been described above as best modes of the invention.

INDUSTRIAL APPLICABILITY

The present invention relates to a method for inspecting a semiconductor chip package, can be applied to an apparatus, a method, and a system for inspecting a semiconductor chip package, and can be used in industrial fields due to repeatability.

The invention claimed is:

1. An apparatus for inspecting a semiconductor chip package, comprising:
a first image acquisition unit configured to use a three-dimensional image of a reference semiconductor chip to obtain a reference image in which a region of interest is removed from the three-dimensional image;
a second image acquisition unit configured to obtain a two-dimensional image of a target semiconductor chip; and
an image processing unit configured to obtain an image of a region of interest of the target semiconductor chip from a difference between the reference image and the two-dimensional image;
wherein the first image acquisition unit includes:
a three-dimensional image acquisition module configured to obtain the three-dimensional image of the reference semiconductor chip and remove one or more regions of interest from the three-dimensional image to obtain the reference image; and
a two-dimensional image acquisition module configured to obtain the reference image in which the reference image obtained by the three-dimensional image acquisition module is converted to a two-dimensional image at a specific angle.

2. The apparatus of claim 1, wherein the second image acquisition unit obtains the two-dimensional image of the target semiconductor chip at the specific angle.

3. The apparatus of claim 2, wherein the reference semiconductor chip and the target semiconductor chip include common regions of interest, and each of the common regions of interest includes an array having a preset form.

4. An apparatus for inspecting a semiconductor chip package, comprising:
a first image acquisition unit configured to use a three-dimensional image and a two-dimensional image of a reference semiconductor chip to obtain a reference image in which a region of interest is removed from the two-dimensional image;
a second image acquisition unit configured to obtain a two-dimensional image of a target semiconductor chip; and
an image processing unit configured to obtain an image of the region of interest from a difference between the reference image and the two-dimensional image of the target semiconductor chip;
wherein the first image acquisition unit includes:
a three-dimensional image acquisition module configured to obtain the three-dimensional image and the two-dimensional image of the reference semiconductor chip and extract an image of the region of interest from the three-dimensional image; and
a two-dimensional image acquisition module configured to convert the image of the region of interest to a two-dimensional image at a predetermined angle and obtain the reference image from which the region of interest is removed and which is obtained from a difference between the converted two-dimensional image and the two-dimensional image of the reference semiconductor chip at the predetermined angle.

5. The apparatus of claim 4, wherein the second image acquisition unit obtains the two-dimensional image of the target semiconductor chip at the predetermined angle.

6. The apparatus of claim 5, wherein the reference semiconductor chip and the target semiconductor chip include common regions of interest, and each of the common regions of interest includes an array having a preset form.

7. The apparatus of claim 6, wherein the array having the preset form includes a ball grid array.

8. A method for inspecting a semiconductor chip package, comprising the steps of:
(x) obtaining a reference image from a three-dimensional image of a reference semiconductor chip, wherein a region of interest is removed from the three-dimensional image;
(y) obtaining a two-dimensional image of a target semiconductor chip; and
(z) obtaining an image of a region of interest of the target semiconductor chip from a difference between the reference image obtained in the step (x) and the two-dimensional image of the target semiconductor chip obtained in the step (y);
wherein:
the step (x) includes a step of removing one or more regions of interest from the three-dimensional image and obtaining the reference image in which the three-dimensional image from which the one or more regions of interest are removed is converted to a two-dimensional image at a specific angle; and
the step (y) includes a step of obtaining the two-dimensional image of the target semiconductor chip at the specific angle.

9. The method of claim 8, wherein the reference semiconductor chip and the target semiconductor chip include common regions of interest, and each of the common regions of interest includes an array having a preset form.

10. A method for inspecting a semiconductor chip package, comprising the steps of:
(i) obtaining a reference image from a two-dimensional image of a reference semiconductor chip, wherein a region of interest is removed from the two-dimensional image;
(ii) obtaining a two-dimensional image of a target semiconductor chip; and
(iii) obtaining an image of a region of interest of the target semiconductor chip from a difference between the reference image obtained in the step (i) and the two-dimensional image of the target semiconductor chip obtained in the step (ii);
wherein:
the step (i) includes a step of obtaining the three-dimensional image of the reference semiconductor chip, extracting the region of interest from the three-dimensional image, and converting the extracted image to the two-dimensional image at a predetermined angle, a step of obtaining, by an apparatus for inspecting a semiconductor chip, the two-dimensional image of the reference semiconductor chip at the predetermined angle, and a step of obtaining, by the apparatus for inspecting a semiconductor chip, the reference image, from which the region of interest is removed, from a difference between the converted two-dimensional image and the two-dimensional image of the reference semiconductor chip; and
the step (ii) includes a step of obtaining the two-dimensional image of the target semiconductor chip at the predetermined angle.

11. A method for inspecting a semiconductor chip package, comprising the steps of:

(i) obtaining a reference image from a two-dimensional image of a reference semiconductor chip, wherein a region of interest is removed from the two-dimensional image;

(ii) obtaining a two-dimensional image of a target semiconductor chip; and (iii) obtaining an image of a region of interest of the target semiconductor chip from a difference between the reference image obtained in the step (i) and the two-dimensional image of the target semiconductor chip obtained in the step (ii);

wherein the reference semiconductor chip and the target semiconductor chip include common regions of interest, and each of the common regions of interest includes an array having a preset form.

12. The method of claim 11, wherein the array having the preset form includes a ball grid array.

\* \* \* \* \*